United States Patent
Kim

(10) Patent No.: US 9,530,768 B1
(45) Date of Patent: Dec. 27, 2016

(54) GATE-COUPLED NMOS DEVICE FOR ELECTRO-STATIC DISCHARGE PROTECTION

(71) Applicant: SK hynix Inc., Gyeonggi-do (KR)

(72) Inventor: Do Hee Kim, Sejong-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/208,038

(22) Filed: Jul. 12, 2016

(30) Foreign Application Priority Data

Feb. 12, 2016 (KR) .................. 10-2016-0016569

(51) Int. Cl.
| | | |
|---|---|---|
| H01L 29/76 | (2006.01) | |
| H01L 27/02 | (2006.01) | |
| H01L 29/08 | (2006.01) | |

(52) U.S. Cl.
CPC ....... *H01L 27/0274* (2013.01); *H01L 27/0288* (2013.01); *H01L 27/0248* (2013.01); *H01L 27/0251* (2013.01); *H01L 27/0292* (2013.01); *H01L 29/0847* (2013.01)

(58) Field of Classification Search
CPC ........... H01L 27/0288; H01L 27/08479; H01L 27/0292; H01L 27/0248; H01L 27/0251
See application file for complete search history.

(56) References Cited

U.S. PATENT DOCUMENTS

| | | | | |
|---|---|---|---|---|
| 5,907,462 A | * | 5/1999 | Chatterjee | ............... H01L 29/87 361/111 |
| 6,566,715 B1 | * | 5/2003 | Ker | ..................... H01L 27/0251 257/355 |
| 8,519,434 B2 | | 8/2013 | Chen et al. | |
| 2005/0082621 A1 | * | 4/2005 | Chen | ................... H01L 27/0277 257/371 |
| 2006/0033163 A1 | * | 2/2006 | Chen | ................... H01L 27/0277 257/355 |
| 2008/0259511 A1 | * | 10/2008 | Worley | ............... H01L 27/0266 361/56 |
| 2008/0310061 A1 | * | 12/2008 | Jeon | .................... H01L 27/0285 361/56 |
| 2009/0067106 A1 | * | 3/2009 | Kim | ...................... H02H 9/046 361/56 |

* cited by examiner

*Primary Examiner* — Nicholas Tobergte
(74) *Attorney, Agent, or Firm* — IP & T Group LLP

(57) ABSTRACT

A gate-coupled NMOS device according to an embodiment includes a P-type well region, an N-type well region, and N-channel MOS transistor, an N+-type tap region, a first conductive layer, and a second conductive layer. The N-type well region surrounds the P-type well region. An inner side of the N-type well region directly contacts a side of the P-type well region. The N-channel MOS transistor is disposed in the P-type well region. The $N^+$-type tap region is disposed in the N-type well region. The first conductive layer is disposed on the N-type well region by interposing a first insulation layer and constitutes a MOS capacitor with the N-type well region and the first insulation layer. The second conductive layer is disposed on the N-type well region by interposing a second insulation layer and constitutes a resistor. A first end portion of the first conductive layer directly contacts a first end portion of the second conductive layer.

21 Claims, 11 Drawing Sheets

GATE-COUPLED NMOS DEVICE FOR ELECTRO-STATIC DISCHARGE PROTECTION

CROSS-REFERENCE TO RELATED APPLICATION

The present application claims priority under 35 U.S.C 119(a) to Korean Patent Application No. 10-2016-0016569, filed on Feb. 12, 2016, which is herein incorporated by reference in its entirety.

BACKGROUND

1. Technical Field

Various embodiments of the present disclosure relate to an electro-static discharge (ESD) protection technology and, more particularly, to gate-coupled NMOS devices for ESD protection.

2. Related Art

Semiconductor devices generally include an ESD protection circuit between pads and inner circuits for protecting the inner circuits. A static electricity may be generated when the pad connected to an external pin of a microchip contacts a charged human body, a charged machine or a charge may be accumulated inside the circuit. The ESD protection circuit avoids chip fails due to the static electricity which is discharged into the inner circuit or flows into the inner circuit. In fabricating the microchips, a technique for designing a protection circuit from an ESD stress is one of key technologies of the chip design. A device used in designing a protection circuit for ESD stress is called an ESD protection device.

There are various types of ESD protection devices used to protect the microchip from ESD stress. A gate-grounded NMOS hereinafter referred to as a GGNMOS ESD protection device may be the most commonly used ESD protection device. The GGNMOS performs an ESD operation by turning-on a parasitic bipolar junction transistor by junction breakdown between a drain and a substrate.

However, a gate bias effect for the ESD protection operation of NMOS has been reported. According to the report, when a predetermined level of bias, for example, 1V to 2V, is applied to a gate of the NMOS, the NMOS can be triggered at a voltage lower than a voltage causing an avalanche breakdown. As such, to ensure that a predetermined level of bias is applied to the gate, a gate-coupled NMOS hereinafter referred to as GCNMOS, in which a capacitor is disposed between the gate and an input pad has been proposed.

SUMMARY

Various embodiments are directed to GCNMOS devices for ESD protection. A gate-coupled NMOS device according to an embodiment includes a P-type well region, an N-type well region, and N-channel MOS transistor, an N+-type tap region, a first conductive layer, and a second conductive layer. The N-type well region surrounds the P-type well region. An inner side of the N-type well region directly contacts a side of the P-type well region. The N-channel MOS transistor is disposed in the P-type well region. The $N^+$-type tap region is disposed in the N-type well region. The first conductive layer is disposed on the N-type well region by interposing a first insulation layer and constitutes a MOS capacitor with the N-type well region and the first insulation layer. The second conductive layer is disposed on the N-type well region by interposing a second insulation layer and constitutes a resistor. A first end portion of the first conductive layer directly contacts a first end portion of the second conductive layer.

BRIEF DESCRIPTION OF THE DRAWINGS

Various embodiments of an inventive concept will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean a relative position relationship, but not used to limit certain cases in which the element directly contacts the other element, or at least one intervening element is present therebetween. Accordingly, terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected, coupled to the other element directly, or may form a connection relationship or coupling relationship by replacing the other element therebetween.

Figure 1:
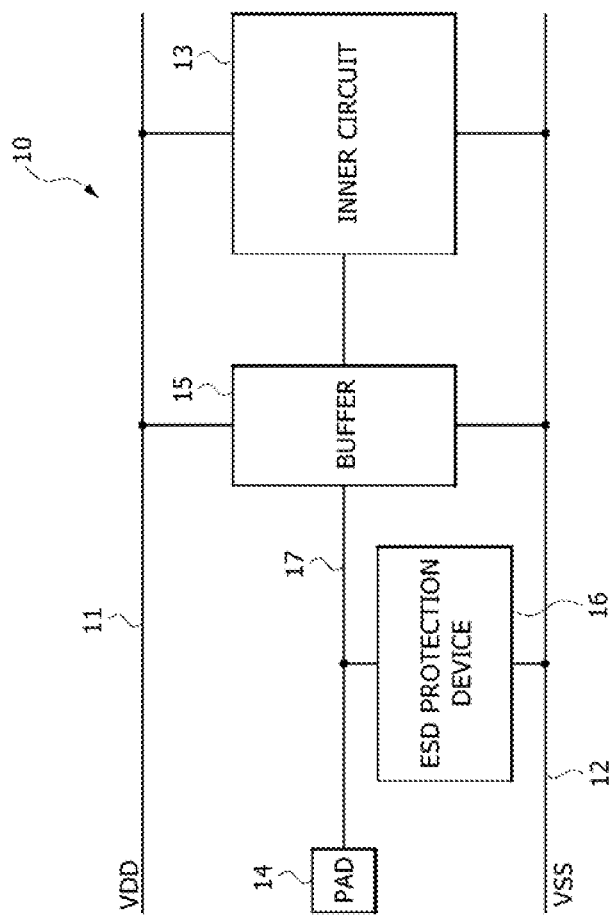
FIG. 1 is a circuit diagram illustrating an input/output portion of a chip including an ESD protection circuit.

FIG. 1 is a circuit diagram illustrating an input/output portion of a chip including an ESD protection circuit. Referring to FIG. 1, the input/output portion 10 of the chip includes an inner circuit 13 that is disposed between a first line 11 coupled to a supply voltage terminal VDD and a second line 12 coupled to a ground voltage terminal VSS. A buffer 15 is disposed between the inner circuit 13 and an input/output pad 14. An ESD protection device 16 such as a GCNMOS device is disposed between a third line 17 connecting the input/output pad 14 to the buffer 15 and the second line 12 coupled to the ground voltage terminal VSS. When an ESD event occurs from the input/output pad 14, the ESD protection device 16 induces ESD current to the ground voltage terminal VSS such that the buffer 15 and inner circuit 13 are protected.

Figure 2:
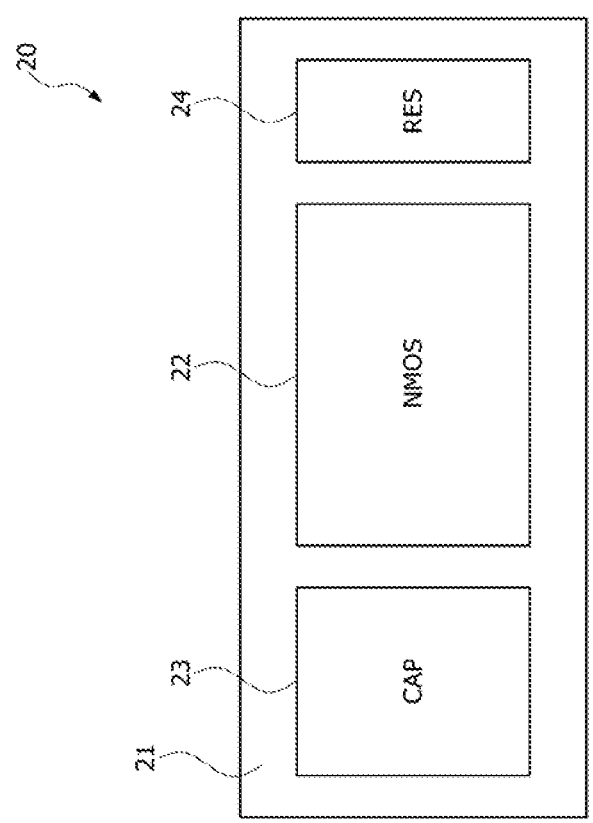
FIG. 2 is a layout diagram schematically illustrating a GCNMOS device.

FIG. 2 is a general layout diagram schematically illustrating a GCNMOS device 20. As shown in FIG. 2, the general GCNMOS device 20 includes an NMOS device region (NMOS) 22, a MOS capacitor region (CAP) 23, and a resistor region (RES) 24 that are disposed in separated regions in an N-type well region 21, respectively. A plurality of N-channel type MOS transistors may be disposed in the NMOS device region (NMOS) 22. A plurality of MOS capacitors may be disposed in the MOS capacitor region (CAP) 23. A plurality of resistors may be disposed in the resistor region (RES) 24. Thus, the general GCNMOS device requires totally large area since the NMOS device region (NMOS) 22, the MOS capacitor region (CAP) 23, and the resistor region (RES) 24 are disposed in separated regions, respectively.

Figure 3:
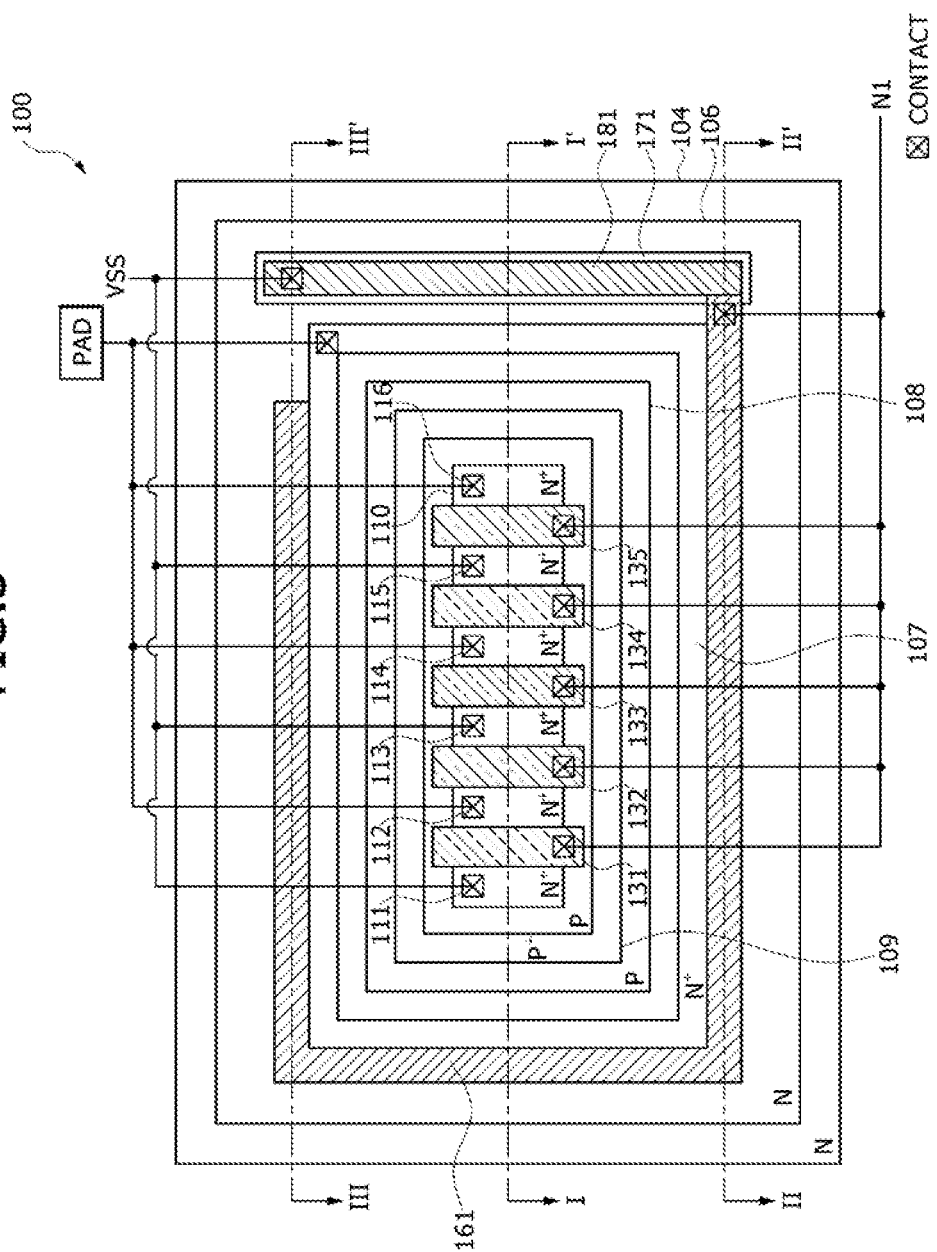
FIG. 3 is a top plane view illustrating a GCNMOS device according to an embodiment.
Figure 4:
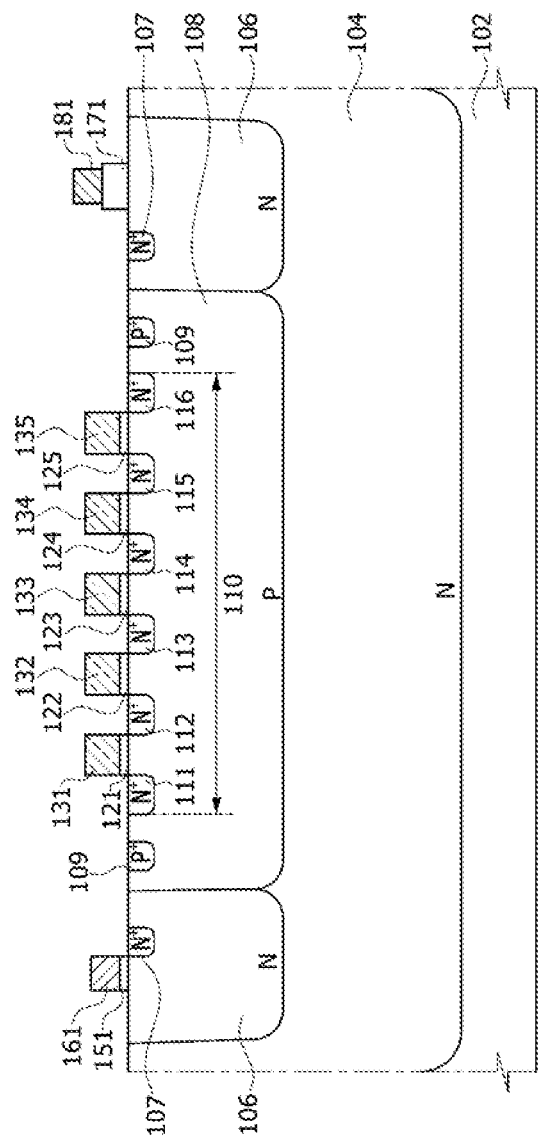
FIG. 4 is a cross-sectional view taken along the line I-I' of FIG. 3.
Figure 5:
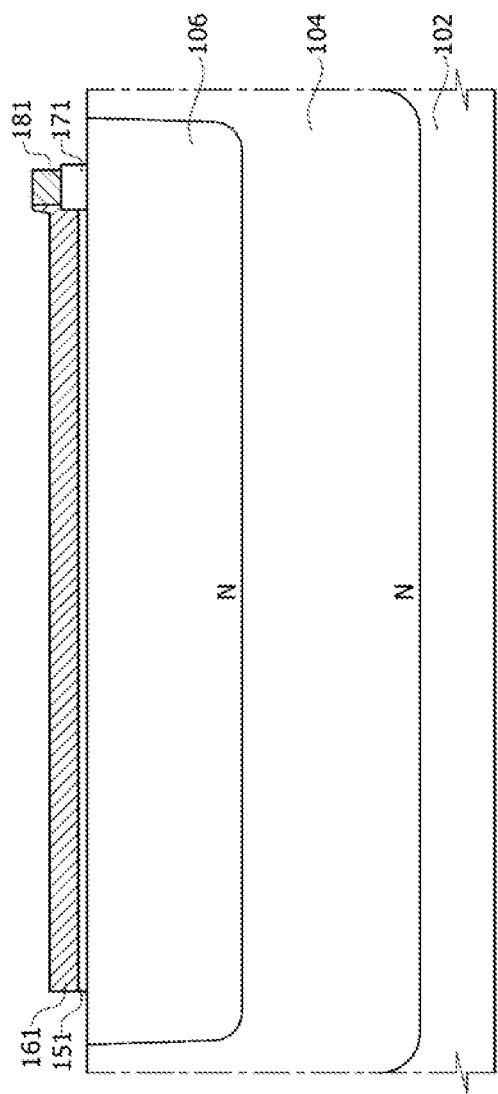
FIG. 5 is a cross-sectional view taken along the line II-II' of FIG. 3.
Figure 6:
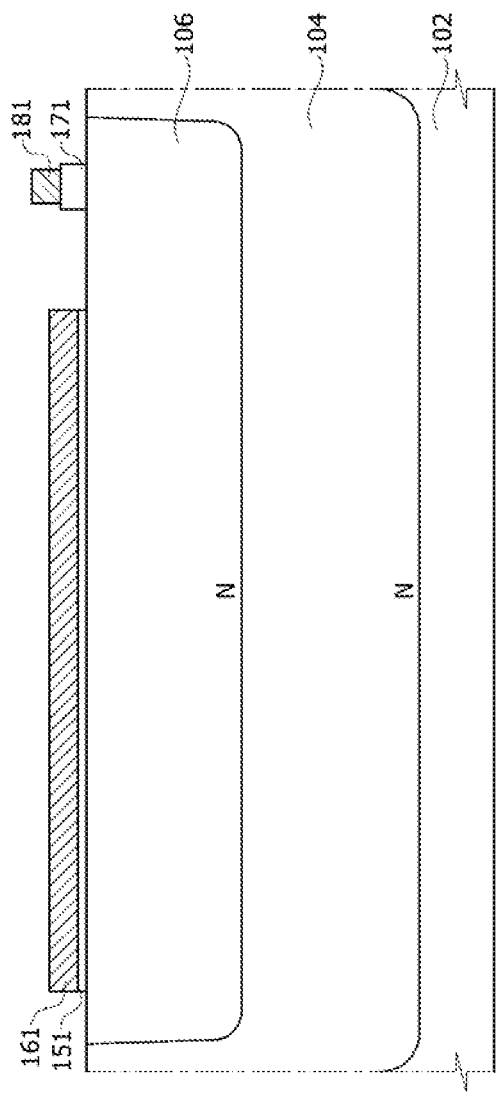
FIG. 6 is a cross-sectional view taken along the line III-III' of FIG. 3.

FIG. 3 is a top plane view illustrating a GCNMOS device according to an embodiment. FIGS. 4 to 6 are cross-sectional views taken along the line I-I', the line II-II', and the line III-III' of FIG. 3, respectively.

Referring to FIGS. 3 to 6, a deep N-well region 104 is disposed in an upper region of a substrate 102. In an embodiment, the substrate 102 may have a conductivity type of P-type. An N-type well region 106 and a P-type well region 108 are disposed in an upper region of the deep N-well region 104. The N-type well region 106 surrounds the P-type well region 108. An inner side of the N-type well region 106 directly contacts a side of the P-type well region 108.

An $N^+$-type tap region 107 is disposed in an upper region of the N-type well region 106. In an embodiment, the $N^+$-type tap region 107 is spaced apart from the P-type well region 108 by a predetermined distance and surrounds the P-type well region 108. The $N^+$-type tap region 107 has a closed ring shape or a closed loop shape. An active region 110 is disposed in an upper region of the P-type well region 108.

Although not illustrated in the drawings, the active region 110 may be defined by an isolation structure such as a shallow trench isolation (STI) layer. A $P^+$-type contact region 109 is spaced apart from the active region 110 in an upper region of the P-type well region 108. The $P^+$-type contact region 109 surrounds the active region 110.

A plurality of $N^+$-type junction regions 111-116 are disposed in the active region 110 along a certain direction. The $N^+$-type junction regions 111-116 are spaced apart from each other by channel regions. The $N^+$-type junction regions 111-116 may form source regions and drain regions which are alternately disposed. In an embodiment, the $N^+$-type junction regions 111, 13, 115 may be source regions, and the $N^+$-type junction regions 112, 114, 116 may be drain regions.

A plurality of gate insulation layers 121-125 is disposed over the active region 110. Gate electrode layers 131-135 are disposed on the gate insulation layers 121-125, respectively. Each of the gate insulation layers 121-125 and each of the gate electrode layers 131-135 overlaps with the channel regions, respectively. The gate insulation layers 121-125, the gate electrode layers 131-135, and the $N^+$-type junction regions 111-116 constitute a plurality of N-channel MOS transistors.

A first insulation layer 151 is disposed in a region over the N-type well region 106. In an embodiment, the first insulation layer 151 may include an oxide layer. A first conductive layer 161 is disposed on the first insulation layer 151. In an embodiment, the first conductive layer 161 may be a poly-silicon layer. The first conductive layer 161 and the first insulation layer 151 are line patterns surrounding a portion of the $N^+$-type tap region 107.

In an embodiment, the $N^+$-type tap region 107 is a line pattern in a rectangular ring shape, and the first conductive layer 161 and the first insulation layer 151 may surround three sides of the $N^+$-type tap region 107. In this case, inner sidewalls of the first conductive layer 161 and first insulation layer 151 may be aligned with an outer sidewall of the $N^+$-type tap region 107. A vertical stack structure of the N-type well region 106, the first insulation layer 151, and the first conductive layer 161 constitutes a MOS capacitor. The N-type well region 106 and first conductive layer 161 may function as a bottom electrode and a top electrode of the MOS capacitor, respectively. Bias may be applied to the N-type well region 106 through the $N^+$-type tap region 107.

A second insulation layer 171 is disposed in another region over the N-type well region 106. In an embodiment, the second insulation layer 171 may be composed of an oxide layer. A second conductive layer 181 is disposed on the second insulation layer 171. In an embodiment, the second conductive layer 181 may be composed of a poly-silicon layer. The second insulation layer 171 has a thickness thicker than the first insulation layer 151. The second insulation layer 171 and second conductive layer 181 are disposed in parallel to an upper surface of the N-type well region 106 which is not surrounded by the first conductive layer 161 and the first insulation layer 151 from the sides of the $N^+$-type tap region 107. The stack of the second insulation layer 171 and the second conductive layer 181 are spaced apart from the outer sidewall of the $N^+$-type tap region 107 by a predetermined distance.

The second conductive layer 181 may extend from a first end portion of the first conductive layer 161. In this case, the first conductive layer 161 and the second conductive layer 181 may have an integrated structure which can be implemented by a single patterning process. Alternatively, the first conductive layer 161 and the second conductive layer 181 may not have an Integrated structure. In this case, a sidewall of the first end portion of the second conductive layer 181 directly contacts a sidewall of the first end portion of the first conductive layer 161. In any case, a second end portion of the second conductive layer 181 is spaced apart from a second end portion of the first conductive layer 161. The second conductive layer 181 may constitute a resistor.

The $N^+$-type tap regions 107 are coupled to an input/output pad through contacts. Each of the $N^+$-type junction regions 112, 114, 116 which constitute the drain region is coupled to the input/output pad through the contacts. Each of the $N^+$-type junction region 111, 113, 115 which constitute the source region is coupled to the ground voltage terminal VSS through the contacts. The second conductive layer 181 is also coupled to the ground voltage terminal VSS at the second end portion through the contact. The first conductive layer 161 is coupled to a first node N1 through the contact at the first end portion. Each of the plurality of the gate electrode layers 131-135 is coupled to the first node N1 through the contact.

According to the embodiment, the first conductive layer 161 constituting a top electrode of the MOS capacitor surrounds a region in which the N channel MOS transistors are disposed, and the second conductive layer 181 constituting the resistor extends from the first end portion of the first conductive layer 161 or directly contacts the first end portion of the first conductive layer 161. Accordingly, it is possible to provide a GCNMOS in a smaller area in comparison with the case of disposing the MOS capacitor and resistor in different regions.

Figure 7:
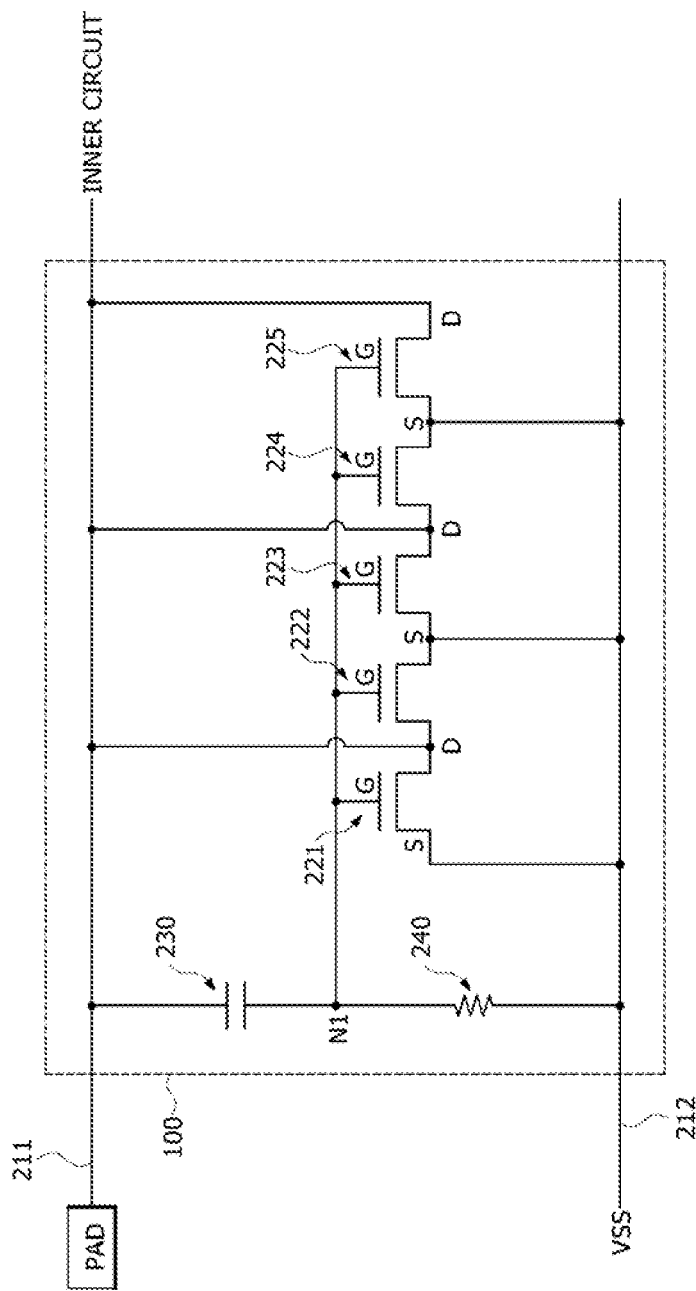
FIG. 7 is an equivalent circuit diagram of the GCNMOS device of FIG. 3.

FIG. 7 is an equivalent circuit diagram of the GCNMOS device of FIG. 3. Referring to FIG. 7, the GCNMOS device 100 is disposed between a first line 211 connecting a pad to an internal circuit and a second line 212 connected to the ground voltage terminal VSS. The GCNMOS device 100 includes a plurality of N-channel MOS transistors 221-225, a capacitor 230 and a resistor 240. Each gate terminal G of each of the N-channel MOS transistors 221-225 is coupled to a first node N1. Each source terminal S of each of the N-channel MOS transistors 221-225 is coupled to the ground voltage terminal VSS through the second line 212. Each drain terminal D of each of the N-channel MOS transistors 221-225 is coupled to the pad through the first line 211. The capacitor 230 is disposed between the first node N1 and the first line 211. The resistor 240 is disposed between the first node N1 and the second line 212. Accordingly, each gate terminal G of each of the N-channel MOS transistors 221-225 is coupled to a terminal of the capacitor 230 and a terminal of the resistor 240 through the first node N1.

Operation of the GCNMOS device 100 according to the embodiment will now be described with reference to FIGS. 4 and 7. When an ESD event occurs from the pad, ESD current flows through the first line 211, and a high voltage is applied to the first line 211. The voltage is applied to the drain terminal D of each of the N-channel MOS transistors 221-225. As the voltage is applied to the $N^+$-type junction regions 112, 114, 116 which function as drain regions, hot holes are generated in the P-type well region 108 adjacent to the $N^+$-type junction regions 112, 114, 116. These hot holes move downward in the P-type well region 108.

As a result, potential of the P-type well region 108 is increased, and a forward bias is applied to a junction of the P-type well region 108 and the $N^+$-type junction regions 111, 113, 115 which function as source regions. Due to this forward bias, parasitic NPN bipolar junction transistors BJTs constituted of the $N^+$-type junction regions 112, 114, 116, the P-type well region 108 and the $N^+$-type Junction regions 111, 113, 115 are turned-on. Thus, the ESD current is drained from the $N^+$-type junction regions 112, 114, 116 to the ground voltage terminal VSS through the $N^+$-type junction regions 111, 113, 115. In this process, a predetermined level of bias is applied to the gate terminals G of each of the N-channel MOS transistors 221-225 by the capacitor 230 and the resistor 240, and a trigger voltage of the parasitic NPN BJT becomes decreased. Value of the bias applied to the gate terminals G may be determined by a capacitance of the capacitor 230 and a resistance of the resistor 240.

Figure 8:
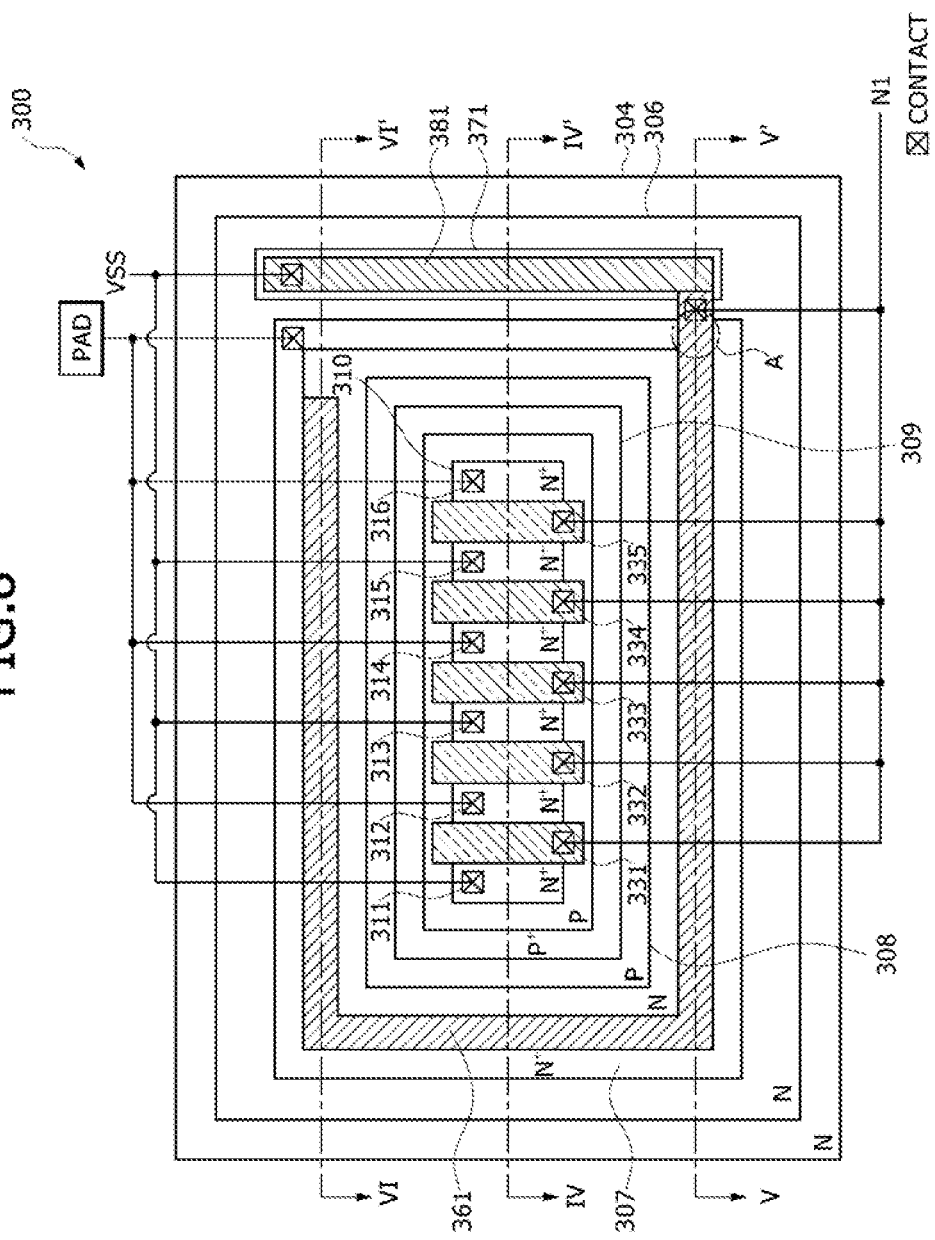
FIG. 8 is a top plane view illustrating a GCNMOS device according to another embodiment.
Figure 9:
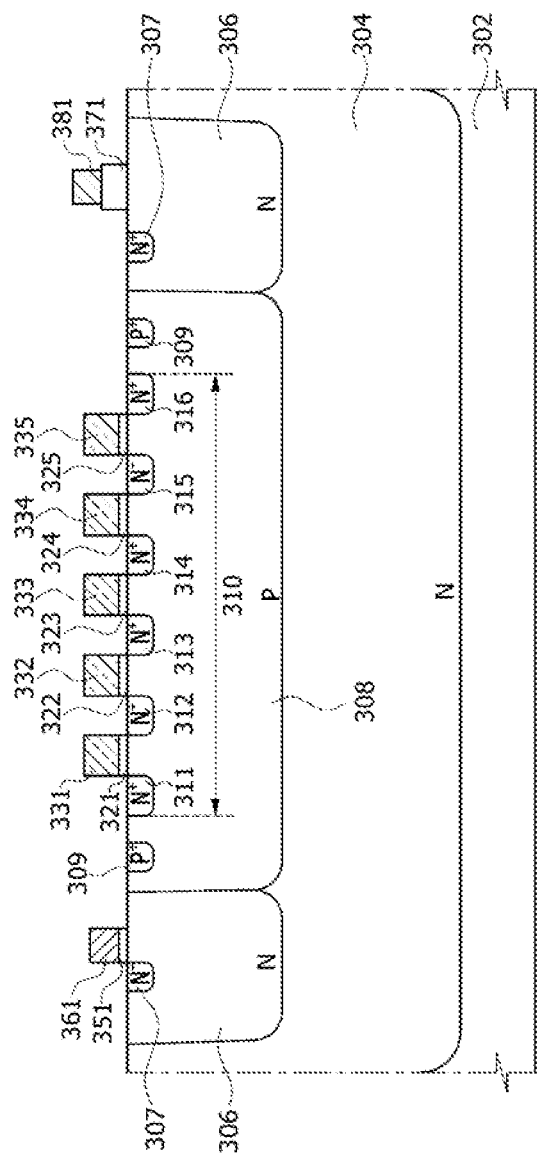
FIG. 9 is a cross-sectional view taken along the line IV-IV' of FIG. 8.
Figure 10:
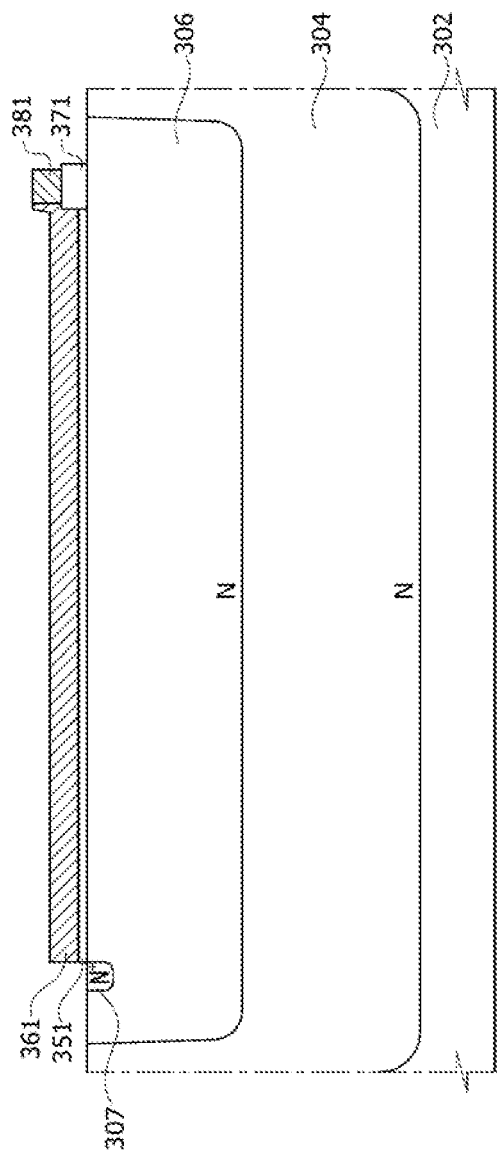
FIG. 10 is a cross-sectional view taken along the line V-V' of FIG. 8.
Figure 11:
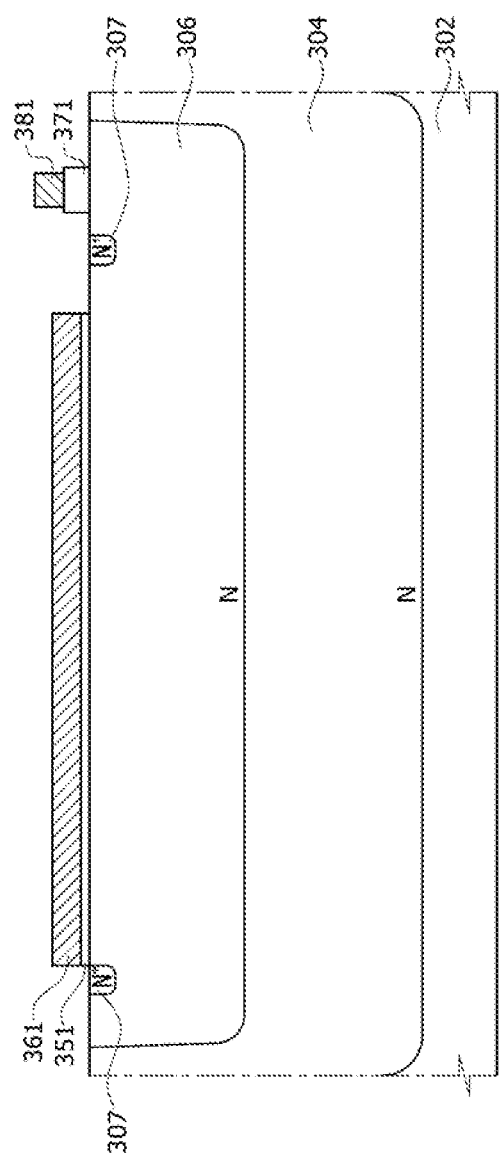
FIG. 11 is a cross-sectional view taken along the line VI-VI' of FIG. 8.

FIG. 8 is a layout diagram illustrating a GCNMOS device according to another embodiment of the present disclosure. FIGS. 9 to 11 are cross-sectional views taken along the lines IV-IV', V-V' and VI-VI' of FIG. 8, respectively.

Referring to FIGS. 8 to 11, a deep N-well 304 is disposed in an upper region of a substrate 302. In an embodiment, the substrate 302 may have a conductivity type of P-type. An N-type well region 306 and a P-type well region 308 are disposed in upper regions of the deep N-well 304. An $N^+$-type tap region 307 is disposed in an upper region of the N-type well region 306. In an embodiment, the $N^+$-type tap region 307 is spaced apart from the P-type well region 308 and surrounds the P-type well region 308. In this embodiment, the $N^+$-type tap region 307, as shown as "A" in FIG. 8, has an opened ring shape or an opened loop shape. That is, the $N^+$-type tap region 307 is opened at a portion where a first conductive layer 361 passes.

An active region 310 is disposed at an upper region of the P-type well region 308. Although not illustrated, the active region 310 may be defined by an isolation structure such as a shallow trench isolation (STI) layer. A $P^+$-type contact region 309 is spaced apart from the active region 310 and in an upper region of the P-type well region 308. The $P^+$-type contact region 309 surrounds the active region 310.

A plurality of $N^+$-type junction regions 311-316 are disposed in the active region 310 along a certain direction. The $N^+$-type junction regions 311-316 are spaced apart from each other by channel regions. The $N^+$-type junction regions 311-316 may serve as source regions and drain regions which are alternately disposed. In an embodiment, the $N^+$-type junction regions 311, 313, 315 may be source regions, and the $N^+$-type junction regions 312, 314, 316 may be drain regions.

A plurality of gate insulation layers 321-325 is disposed over the active region 310. Gate electrode layers 331-335 are disposed on the gate insulation layers 321-325, respectively. Each the gate insulation layers 321-125 and each the gate electrode layers 331-135 overlaps with the channel regions, respectively. The gate insulation layers 321-325, the gate electrode layers 331-335, and the $N^+$-type junction regions 311-316 constitute a plurality of N-channel MOS transistors.

A first insulation layer 351 is disposed in a region over the N-type well region 306. In an embodiment, the first insulation layer 351 may be composed of an oxide layer. A first conductive layer 361 is disposed on the first insulation layer 351. In an embodiment, the first conductive layer 361 may be composed of a polysilicon layer. The stack of the first conductive layer 361 and the first insulation layer 351 is disposed in a planar structure and is surrounded by the $N^+$-type tap region 307 except a first end portion of the stack, as shown in FIG. 8.

In an embodiment, when the $N^+$-type tap region 307 has a planar structure of a rectangular ring shape, three sidewalls of the stack of the first conductive layer 361 and the first insulation layer 351 may be surrounded by the $N^+$-type tap region 307. In this case, an outer sidewall of the stack of the first conductive layer 361 and the first insulation layer 351 may be aligned with an inner sidewall of the $N^+$-type tap region 307.

A vertical stack structure of the N-type well region 306, the first insulation layer 351, and the first conductive layer 361 constitutes a MOS capacitor. The N-type well region 306 and the first conductive layer 361 may function as a bottom electrode and a top electrode of the MOS capacitor, respectively. Bias may be applied to the N-type well region 306 through the $N^+$-type tap region 307.

A second insulation layer 371 is disposed in another region over the N-type well region 306. In an embodiment, the second insulation layer 371 may be composed of an oxide layer. A second conductive layer 381 is disposed on the second insulation layer 371. In an embodiment, the second conductive layer 381 may be composed of a polysilicon layer. The second insulation layer 371 has a thickness thicker than the first insulation layer 351. The stack of the second insulation layer 371 and the second conductive layer 381 is disposed in parallel to a fourth sidewall of the active region 310 which is not surrounded by the stack of the first conductive layer 361 and the first insulation layer 351. The stack of the second insulation layer 371 and the second conductive layer 381 is spaced apart from the outer sidewall of the $N^+$-type tap region 307 by a predetermined distance.

The second conductive layer 381 may extend from the first end portion of the first conductive layer 361. In this case, the first conductive layer 361 and the second conductive layer 381 may have an integrated structure which can be implemented by a single patterning process. Alternatively, the first conductive layer 361 and the second conductive layer 381 may not have the integrated structure. In this case, a sidewall of the first end portion of the second conductive layer 381 directly contacts a side of the first end portion of the first conductive layer 361. In any case, a second end portion of the second conductive layer 381 is spaced apart from a second end portion of the first conductive layer 361. The second conductive layer 381 may constitute a resistor.

The $N^+$-type tap regions 307 are coupled to an input/output pad through contacts. Each of the $N^+$-type Junction regions 312, 314, 316 which constitute the drain regions is coupled to the input/output pad through the contacts. Each of the $N^+$-type junction region 311, 313, 315 which serves as the source regions is coupled to the ground voltage terminal VSS through a contact. The second conductive layer 381 is also coupled to the ground voltage terminal VSS at the second end portion through a contact. The first conductive layer 361 is coupled to a first node N1 at the first end portion through a contact. Each of the plurality of the gate electrode layers 331-335 is coupled to the first node N1 through a contact.

According to the embodiment, the first conductive layer 361 constituting the top electrode of the MOS capacitor surrounds a region in which the N channel MOS transistors are disposed, and the second conductive layer 381 constituting the resistor extends from the first end portion of the first conductive layer 361 or directly contacts the first end portion of the first conductive layer 361. Accordingly, it is possible to form a GCNMOS in a smaller area in comparison with the case of disposing the MOS capacitor and resistor in different regions. An equivalent circuit diagram of the GCNMOS device 300 according to the embodiment is substantially the same as the equivalent circuit diagram of FIG. 7. In addition, operation of the GCNMOS device 300 of the embodiment is also substantially the same as operation of the GCNMOS device 100 described with reference to FIGS. 7 and 4.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A gate-coupled NMOS device comprising:
   a P-type well region;
   an N-type well region surrounding the P-type well region;
   an N-channel MOS transistor disposed in the P-type well region;
   an $N^+$-type tap region disposed in the N-type well region;
   a first conductive layer disposed over the N-type well region by interposing a first insulation layer and constituting a MOS capacitor with the N-type well region and the first insulation layer; and
   a second conductive layer disposed over the N-type well region by interposing a second insulation layer and constituting a resistor,
   wherein a first end portion of the first conductive layer contacts a first end portion of the second conductive layer.

2. The gate-coupled NMOS device of claim 1, wherein an inner side of the N-type well region directly contacts a side of the P-type well region.

3. The gate-coupled NMOS device of claim 1, further comprises:
   a deep N-well region surrounding the P-type well region and the N-type well region.

4. The gate-coupled NMOS device of claim 1, further comprises:
   a $P^+$-type contact region disposed in the P-type well region.

5. The gate-coupled NMOS device of claim 4, further comprises:
   an active region disposed in the P-type well region,
   wherein the N-channel MOS transistor is disposed in the active region, and
   wherein the $P^+$-type contact region is disposed to be spaced apart from the active region and to surrounds the active region.

6. The gate-coupled NMOS device of claim 1,
   wherein the $N^+$-type tap region is spaced apart from the P-type well region and surrounds the P-type well region.

7. The gate-coupled NMOS device of claim 6,
   wherein the $N^+$-type tap region has a closed rectangular ring shape.

8. The gate-coupled NMOS device of claim 7,
   wherein the first insulation layer and the first conductive layer surround first to third sidewalls of the $N^+$-type tap region.

9. The gate-coupled NMOS device of claim 8,
   wherein inner sidewalls of the first insulation layer and first conductive layer are aligned with an outer sidewall of the $N^+$-type tap region.

10. The gate-coupled NMOS device of claim 8,
    wherein the second insulation layer and the second conductive layer are disposed in parallel to a fourth sidewall of the $N^+$-type tap region, and
    wherein the fourth sidewall is not surrounded by the first insulation layer and the first conductive layer.

11. The gate-coupled NMOS device of claim 6,
    wherein the $N^+$-type tap region has an opened rectangular ring shape.

12. The gate-coupled NMOS device of claim 11,
    wherein the first insulation layer and the first conductive layer are surrounded by first to third sidewalls of the $N^+$-type tap region.

13. The gate-coupled NMOS device of claim 12,
    wherein outer sidewalls of the first insulation layer and the first conductive layer are aligned with an inner side of the $N^+$-type tap region.

14. The gate-coupled NMOS device of claim 12,
    wherein the second insulation layer and the second conductive layer are disposed in parallel to a fourth sidewall of the $N^+$-type tap region, and
    wherein the fourth sidewall is not surrounded by the first insulation layer and the first conductive layer.

15. The gate-coupled NMOS device of claim 1, wherein a first end portion of the first conductive layer directly contacts a first end portion of the second conductive layer.

16. The gate-coupled NMOS device of claim 1,
    wherein the first and the second conductive layers have an Integrated structure.

17. The gate-coupled NMOS device of claim 16,
    wherein each of the first and the second conductive layers includes a polysilicon layer.

18. The gate-coupled NMOS device of claim 1,
wherein the second insulation layer is thicker than the first insulation layer.

19. The gate-coupled NMOS device of claim 1,
wherein a second end portion of the second conductive layer is spaced apart from a second end portion of the first conductive layer by a predetermined distance.

20. The gate-coupled NMOS device of claim 1, wherein the N-channel MOS transistors comprise:
a source region and a drain region;
a channel region between the source region and the drain region;
a gate insulation layer disposed over the channel region; and
a gate electrode disposed over the gate insulation layer.

21. The gate-coupled NMOS device of claim 20,
wherein the gate electrode and the first conductive layer are coupled to a first node,
wherein the first conductive layer is coupled to the first node at the first end portion through a contact,
wherein the $N^+$-type tap region and the drain region are coupled to an input/output pad,
wherein the second conductive layer is coupled to a ground voltage terminal, and
wherein the second conductive layer is coupled to the ground voltage terminal at a second end portion through the contact.

* * * * *